United States Patent [19]
Marchetti

[11] 3,959,729
[45] May 25, 1976

[54] ELECTRO-OPTIC TUNING INDICATOR

[75] Inventor: John A. Marchetti, Staten Island, N.Y.

[73] Assignee: Matsushita Electric Industrial Co., Ltd., Kadoma, Japan

[22] Filed: Mar. 25, 1974

[21] Appl. No.: 454,301

[52] U.S. Cl.............................. 325/455; 250/227; 334/87; 340/380; 350/96 B
[51] Int. Cl.² ......................................... H04B 1/06
[58] Field of Search ............ 325/455; 340/149, 307, 340/318, 324, 380; 350/96 B; 250/201, 548, 559, 227; 240/2.1; 116/124.1 R, 124.1 A, DIG. 31, DIG. 26, 124.4; 334/87

[56] References Cited
UNITED STATES PATENTS

| | | | |
|---|---|---|---|
| 3,222,666 | 12/1965 | Hallden | 340/324 |
| 3,555,539 | 1/1971 | Richards | 340/324 |
| 3,639,747 | 2/1972 | Schmidt | 240/2.1 |
| 3,693,019 | 9/1972 | Grenda et al. | 250/219 D |
| 3,753,119 | 8/1973 | Close | 325/455 |
| 3,857,361 | 12/1974 | Gibson et al. | 325/464 X |
| 3,889,196 | 6/1975 | Gibson et al. | 325/455 |

Primary Examiner—Benedict V. Safourek
Assistant Examiner—Aristotelis M. Psitos

[57] ABSTRACT

A receiver selectively and variably tunable to one of a number of broadcast stations has an electro-optic tuning indicator for providing a visual indication of a selected station. The indicator includes a station encoder having a plurality of sets of indicia representative of a plurality of frequencies of the broadcast stations which are arranged to move past a reading station as the receiver is tuned. Positioned at the reading station is an optical reader including a light source arranged on one side of the station encoder and a fiber optic bundle having its proximal end arranged on the opposite side of the station encoder for alignment with a set of indicia. A photoelectric device forming the input to an electrical digital decoder is coupled to the distal end of the fiber optic bundle. The output of the digital decoder is coupled to a digital display. When the receiver is tuned to a station, light is transmitted through a set of indicia aligned at the reading station and the fiber optic bundle to the electrical decoder where it is detected and translated into signals for activating the digital display.

6 Claims, 7 Drawing Figures

ELECTRO-OPTIC TUNING INDICATOR

The invention relates to receivers which are tunable to one of a plurality of stations in a broadcast band and in particular to an indicator for selectively and variably displaying a number indicative of the station to which the receiver is tuned.

Numerous home entertainment devices, such as television receivers and AM and FM radios, detect and reproduce, radio frequency signals transmitted by broadcast stations. These receivers generally have variable and selectively tunable circuits which are used to select one of a number of stations in a broadcast band. A tuning indicator mounted in the receiver housing and coupled to the tuning circuits provides a visual indication of a selected station. In radio receivers, the tuning indicator generally indicates the carrier frequency of the selected station; in television receivers, the tuning indicator displays the "channel" number. It is, of course, understood that the "channel" number of a television receiver is associated with a particular station carrier frequency. Hereinafter, the number identifying a particular broadcast station will be referred to as the "frequency" of that station.

Many different types of tuning indicators have been used or are suggested in the prior art. In one typical tuning indicator, the frequencies are imprinted on a disc which moves relative to a window positioned in the housing of the receiver through which the frequencies of the stations can be observed incident to tuning of the receiver by the user. In another type of tuning indicator, the frequencies are imprinted on a fixed scale and a pointer is arranged to move relative to the fixed scale as the receiver is tuned. However, these tuning indicators are often difficult to read and do not always provide an accurate indication of the station being received. As a consequence, the user of the receiver often ignores the tuning indicator and relies upon the sense of hearing to determine which station is actually being received and when the receiver is properly tuned to that station.

In copending application Ser. No. 409,940, entitled "Tuning Indicator for Radio Frequency Receiver," filed by Nakamura et al. on Oct. 26, 1973, and assigned to the same assignee as the instant application, there is disclosed a tuning indicator for radio and television receivers which is both accurate and easy to read. In that tuning indicator, the frequencies indicative of the stations to be selected are encoded as sets of indicia on a station encoder such as a paper tape or photographic film. The encoder is mounted in the receiver housing for movement past a reading station during tuning of the receiver. Also arranged in the receiver is: an optical reader including a light source positioned at the reading station on one side of the station encoder; a fiber optic bundle having its proximal ends positioned at the reading station adjacent the opposite side of the station encoder for alignment with the sets of indicia; and a segmented bar digital display mounted on the receiver housing. The distal ends of the fiber optic bundle are directly coupled to the individual segments of the display. When the receiver is tuned to a particular selected station, the set of indicia corresponding to the selected station is aligned at the reading station for reading by the optical reader. Light from the light source is transmitted through the indicia and the fiber optic bundle lighting segments of the digital display to indicate the selected station. When the receiver is not tuned to any station the display is extinguished. While this tuning indicator provides an accurate indication of the selected station, it requires an encoding position on the station encoder and an optical fiber corresponding to each segment of the digital display.

Accordingly, it is an object of the present invention to provide a tuning indicator for selectively tunable receivers, such as AM and FM radios and television receivers. More specifically, it is an object of the present invention to provide an electro-optic tuning indicator for such receivers which is accurate, relatively easy to read and which displays a station frequency only when the receiver is tuned to a selected station.

It is a further object of the present invention to provide such a tuning indicator with a frequency encoding system requiring a relatively simple optical system for decoding.

In accordance with one illustrative embodiment of the present invention, the tuning indicator for a receiver selectively tunable to a selected broadcast station includes a digital display mounted on the receiver for viewing by the user of the receiver. Mounted in the receiver for movement as the receiver is tuned is a station encoder having the frequency of the selected station encoded thereon as a set of indicia. Positioned at a reading station in the receiver, adjacent the path of movement of the station encoder, is an optical reader which includes a light source arranged on one side of the station encoder and a fiber optic bundle having its proximal ends arranged on the opposite side of the station encoder for alignment with the set of indicia on the station encoder. The indicator further has an electrical decoder including a photoelectric device positioned at the distal ends of the fiber optic bundle and an output means coupled to a digital decoder.

In operation, the station encoder moves relative to the reading station as the receiver is tuned. When a particular station is selected, the set of indicia corresponding to that station is aligned in the optical reader and light from the light source is transmitted through the indicia and fiber optic bundle to the photoelectric device in the electrical decoder which produces electrical signals corresponding to the encoded station frequency information. The decoders translate the encoded information into signals for activating the digital display to form an indication of the selected station.

The foregoing brief description and other objects, features and advantages of the present invention will appear more fully hereinafter from a consideration of the following detailed description of a presently preferred but illustrative embodiment when taken together with the accompanying drawings wherein.

In conventional radio and television receivers, a receiving antenna detects signals transmitted from distant broadcast stations and couples them to demodulator circuitry. The demodulator circuitry includes a first stage having a high frequency, or r.f., amplifier which amplifies the incoming signals. In the next stage, the high frequency signal from the r.f. amplifier and a signal from a local oscillator in the receiver are applied to a converter which produces a signal at a constant intermediate frequency equal to the difference between the incoming carrier frequency signal and the resonant frequency of the local oscillator. The intermediate frequency signal is amplified in the intermediate frequency, or i.f., stages of the receiver and then demodulated or detected. In general, the receiver is tuned by varying the capacitance of a variable capacitor in the local oscillator to change the resonant frequency of the oscillator.

Figure 1:
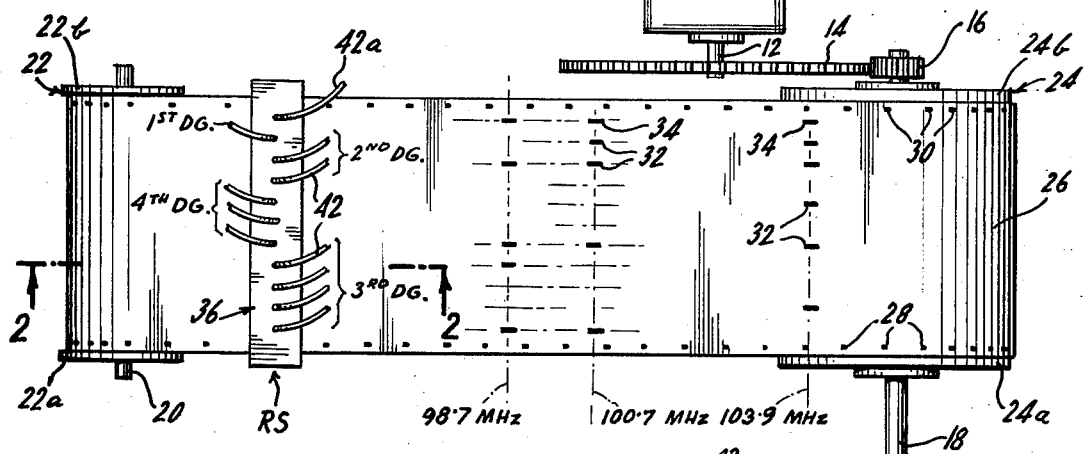
FIG. 1 is a top plan and schematic representation of a tuning indicator according to the present invention, shown for illustrative purposes in an FM receiver but adaptable for use generally in any selectively tunable receiver.

Referring now to FIG. 1, there is shown, for illustrative purposes, a representation of an FM receiver modified to include the tuning indicator of the present invention. It is understood that other types of radio receivers, or television receivers, can also be modified to include this tuning indicator. The conventional demodulator circuitry, including r.f. amplifiers, converter, local oscillator, i.f. amplifiers and detector, is designated by reference numeral 10. Shaft 12, extending from demodulator circuitry 10, has one end (not shown) coupled in circuitry 10 to the capacitor in the local oscillator and the opposite end coupled through gears 14 and 16, mounted on the receiver housing, to shaft 18 which, in turn, is connected to a tuning knob (not shown).

In tuning the receiver to select a broadcast station, the tuning knob and shaft 18 are rotated thereby rotating gears 16 and 14 and shaft 12 which changes the capacitance and resonant frequency of the local oscillator. During tuning, the selected broadcast station, having a carrier frequency which is at a fixed frequency difference from the resonant frequency of the local oscillator, is detected. Typically, in one previous tuning indicator, the station frequencies are imprinted on a disc which rotates with shaft 18 past a window positioned in the housing of the receiver through which the frequencies of the stations can be observed incident to tuning of the receiver by the user. In another type of tuning indicator, a pointer is coupled to shaft 18 and moves along a graduated scale as the shaft is rotated to indicate the frequency of the received station.

In accordance with the illustrative embodiment of the present invention, the conventional FM receiver is modified to include a tuning indicator 26 for accurately displaying, in easy to read format, the carrier frequency of a selected station. The tuning indicator includes a shaft 20 rotatably supported on the receiver housing in parallel spaced apart relationship with shaft 18. Mounted on shaft 20 is a drum 22, having flanges 22a, 22b at its opposite ends; mounted on shaft 18 is drum 24, having flanges 24a, 24b on its opposite ends. Projecting outwardly and extending around the periphery of drum 24 adjacent the opposite ends of the drum are a row of sprockets (not shown).

Trained for movement around drums 22 and 24 between flanges 22a, 22b, and 24a, 24b is closed loop station encoder 26 having rows of perforations 28, 30 which are engaged by the sprockets on drum 24. Encoded on the station encoder, as sets of indicia in binary form, are the frequencies of the broadcast stations which can be selected by the user of the receiver. A typical set of indicia is indicated by reference numeral 32. Due to the relative ease and accuracy of manufacture, it is preferred that the station encoder be manufactued of an elongated closed loop of photograhic film with the indicia in the form of elongated undeveloped spots on developed film. An additional alignment index, 34, is associated with each set of indicia and is used for alignment purposes, as will be discussed in greater detail below.

For the conventional FM receiver illustrated, advantage can be taken of the fact that the frequency allocations for the broadcast stations in the FM frequency band, between 88–108 Mhz, require that only certain digits be displayed at the various positions in the multidigit display. In the example of the FM receiver shown, the display in the first (leftmost) digit is either blank or "1"; the second digit is either "8", "9", or "0"; the third digit can be "0"–"9"; and the fourth digit is "1", "3", "5", "7", or "9". By using this information, each station frequency can be encoded on the station encoder in a column with ten possible positions; with each digit to be displayed separately encoded in binary form. Thus, the first digit requires one position in the column; the second digit two positions; the third digit four positions; and the fourth digit three positions. Three sets of indicia, for encoding 98.7 Mhz, 100.7 Mhz, and 103.9 Mhz, are shown for the purposes of illustration. Of course, when the tuning indicator is used in other radio receivers or in television receivers, the sets of indicia are changed accordingly to encode the information necessary to identify stations to be selected by the user of the particular receiver.

Figure 2:
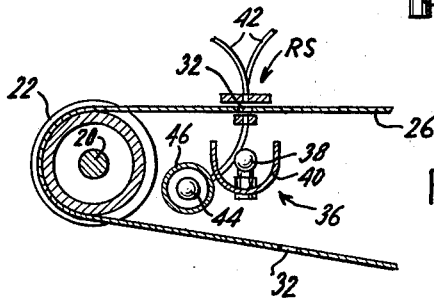
FIG. 2 is a fragmented, sectional view taken along the line 2—2 of FIG. 1 and looking in the direction of the arrow and showing in detail the optical reader of the present invention.

Arranged adjacent encoder 26 at a reading station, RS, is optical reader 36, shown in greater detail in FIG. 2. The optical reader includes light source 38, mounted on one side of encoder 26, having a reflector 40 positioned to concentrate and direct the light toward the reading station, RS. Mounted on the opposite side of the encoder is fiber optic bundle 42 having its proximal end terminating at the reading station for alignment with the indicia on the encoder. For the FM receiver illustrated, eleven individual fibers are required; ten fibers corresponding to each of the possible positions of an indicia for encoding the digits to be displayed; and the eleventh fiber, 42a, for alignment with alignment index 34.

The optical reader also has an alignment indicator which activates light source 38 only when a set of indicia is properly aligned at the reading position. The alignment indicator includes a light source 44 surrounded by shield 46 and an optical fiber 48 coupled between shield 46 and the reading station for alignment with the alignment index 34 associated with each set of indicia.

Figure 3:
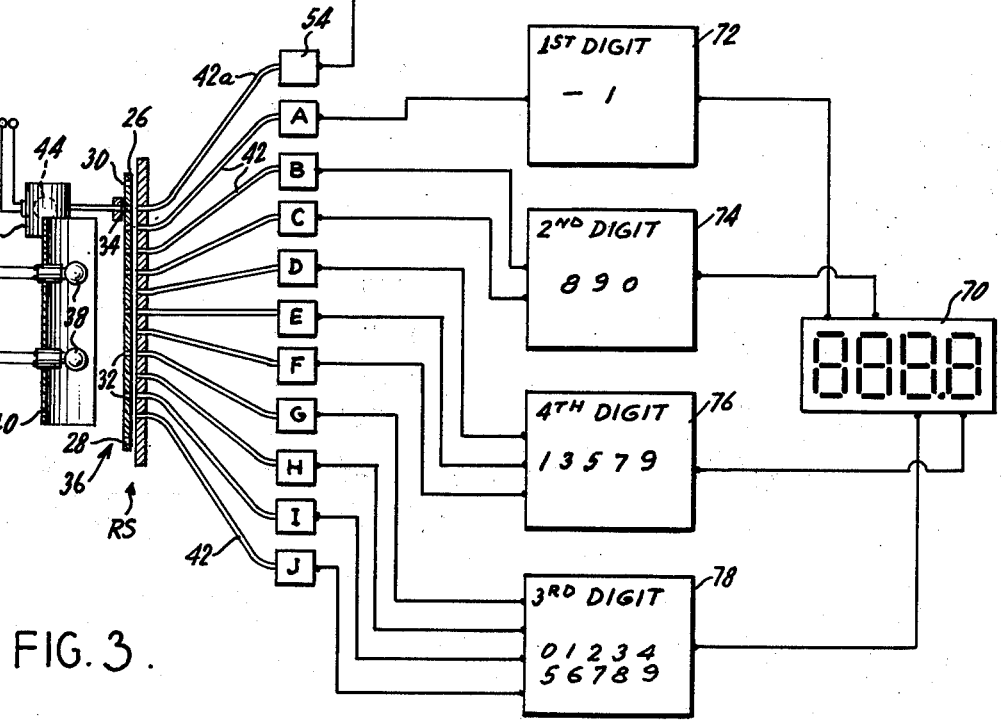
FIG. 3 is a diagramatic and schematic representation of the overall electrical and optical system for producing one form of digital display according to the present invention.

In operation, a broadcast station is selected by rotation of shaft 18 which, through gears 16, 14 and shaft 12, varies the capacitance of the local oscillator in the demodulator circuit 10. Rotation of shaft 18 produces rotation of drum 24 which drives encoder 26, through the engagement of perforations 28 and 30 on the encoder by the sprockets on drum 24, producing movement of the encoder around drums 22 and 24 and movement of the indicia relative to the reading station, RS. Each set of indicia is positioned on the encoder so that when the receiver is tuned to a selected station, the set of indicia corresponding to the selected station is aligned at the reading station to be read by optical reader 36. With a set of indicia aligned at the reading station, the optical reader produces light signals corresponding to the binary encoded station frequency information on the encoder. The light signals are converted into electrical signals to activate segments of the segmented display thereby providing a visual indication of the selected station. FIG. 3 shows in diagramatic and schematic form the overall electrical and optical system for producing one form of the digital display.

Referring now to FIG. 3, with the receiver tuned to a selected station, and one of the sets of indicia aligned at the reading station, light from light source 44 is transmitted through fiber 48, the alignment index associated with the set of indicia, and fiber 42a to photoelectric device 54, such as a photocell, which converts the light into an electrical signal which is applied to gate 56. The other signal to gate 56 is derived from the receiver (shown schematically as 58) to indicate that a station is being received. When both signals are present, the gate provides an output signal which is amplified by amplifier 60. The output from amplifier 60 activates light source 38 which, as explained in detail below, produces a display of the frequency of the received station on digital display 70. If a set of indicia are not aligned at the reading position, light cannot be transmitted through the encoder to photoelectric device 54, light source 38 is deactivated, and the display is extinguishd. The alignment indicator therefore insures that the receiver is properly tuned to a station before the display is activated.

With light source 38 activated, light is transmitted through the indicia on the station encoder forming the encoded station frequency and the individual fiber optics aligned with the indicia to photoelectric devices A-J, coupled to the distal ends of the fibers which form the input to an electrical decoder. The photoelectric devices convert the light energy into electric signals which represent, in binary form, each digit in the station frequency to be displayed. The electrical signals are applied to decoders, 72, 74, 76, 78 for translation into signals which activate the segments of the seven bar segmented digital display 70.

Figure 4:
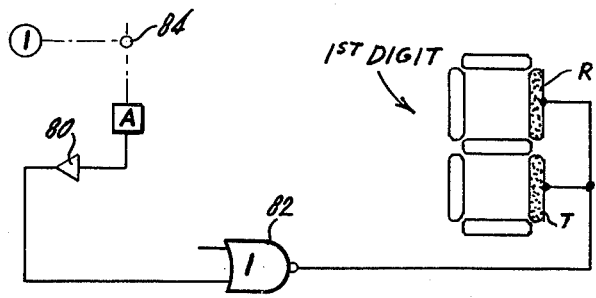
FIG. 4 is a detailed diagramatic and schematic representation of the electrical and optical system for displaying the first digit in a typical display.

FIG. 4 shows in greater detail the electrical and optical system for displaying the first (leftmost) digit in the display. This system includes photocell A; decoder 72 including inverter 80 and NOR gate 82; and the first digit of the display. For the FM receiver illustrated, this position displays either a "1" or no display. The indicia on the encoder is represented by hole, 84, and if a "1" is to be displayed as the first digit, hole 84 is present in the encoder and light is transmitted through hole 84 to photocell A. With light incident on photocell A, a "high" output electrical signal is produced which is inverted by inverter 80 to provide a "low" input signal to NOR gate 82. NOR gate 82 is designated "1" since it decodes an input signal to produce an output signal used to form the decimal digit "1". Since both inputs to the NOR gate are "low", the output of the gate is "high". This "high" electrical signal activates the R and T segments of the segmented display thus forming a "1" for the first digit.

Figure 5:
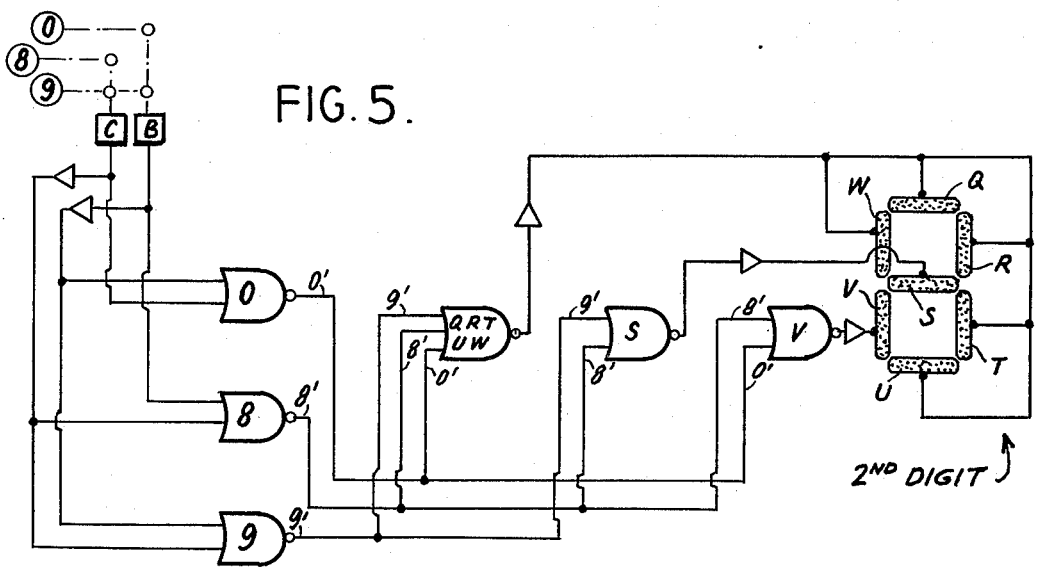
FIG. 5 is a detailed diagramatic and schematic representation of the electrical and optical system for displaying the second digit in such typical display.
Figure 6:
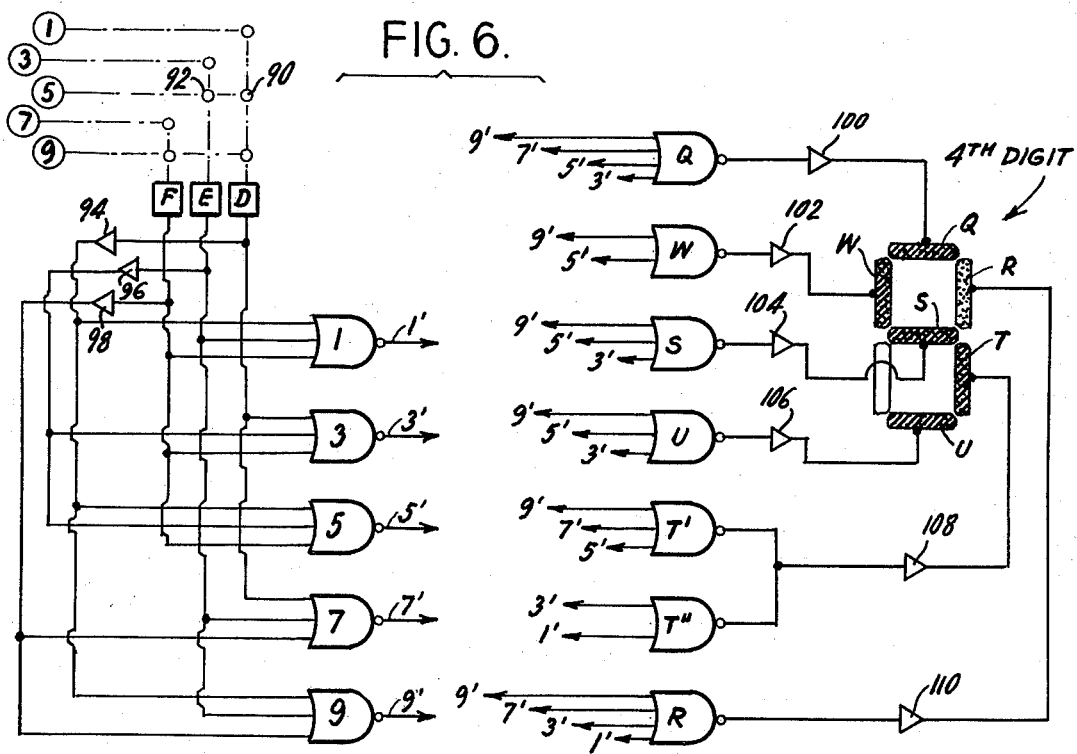
FIG. 6 is a detailed diagramatic and schematic representation of the electrical and optical system for displaying the fourth digit in such typical display.
Figure 7:
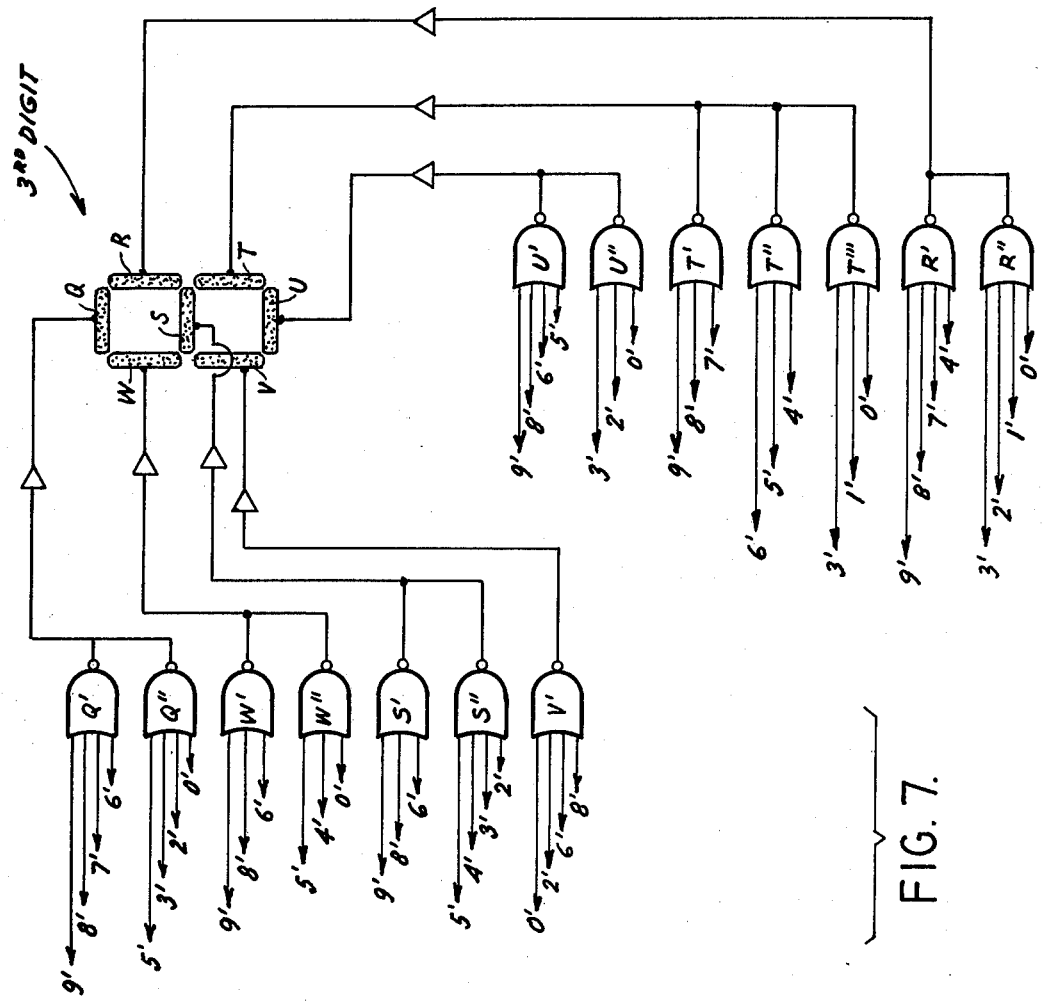
FIG. 7 is a detailed diagramatic and schematic representation of the electrical and optical system for displaying the third digit in the display.
Figure 7:
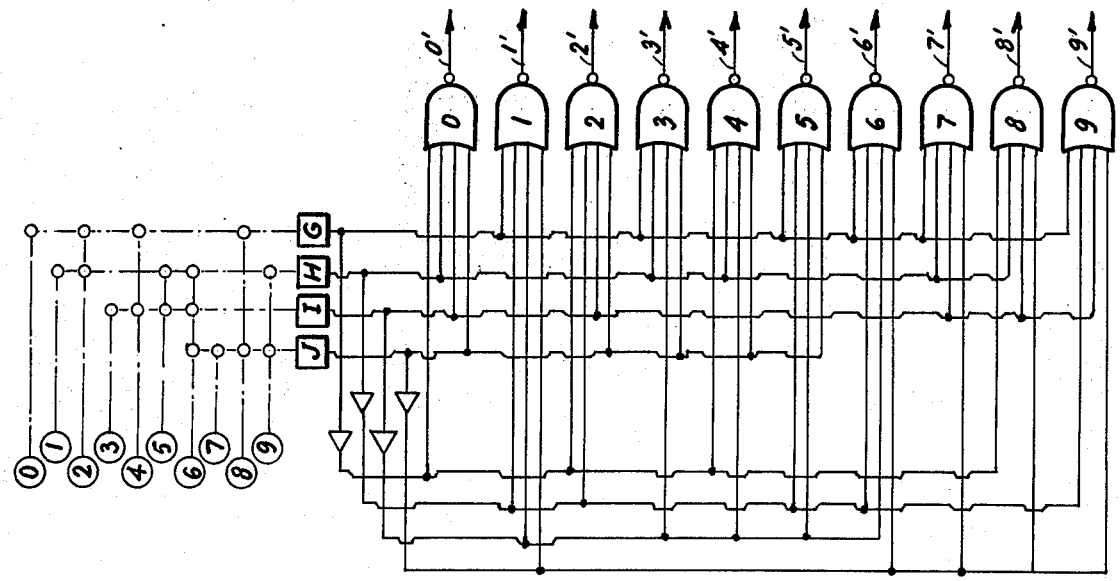

FIGS. 5, 6 and 7, representing the electrical and optical systems for displaying the second, fourth and third digits respectively, operate in a manner similar to the operation of FIG. 4. Each of the decoders 74, 76 and 78 is arranged with a first decoding stage having a NOR gate associated with each digit which is to be displayed. Thus in the system, for displaying the second digit shown in FIG. 5, the first stage has NOR gates designated 0, 8, 9 for the three possible digits which are to be displayed in that position. Similarly, the first stage decoders of FIG. 6, for the fourth digit, have NOR gates designated 1, 3, 5, 7 9 and the first stage decoders, for the third digit, FIG. 7, have NOR gates designated 0–9. It must be borne in mind that the display of only a limited number of digits is shown for illustrative purposes only, and that the scope of the invention is not limited thereby.

The output signals from the NOR gates of the first decode stage are coupled to a second decode stage which has NOR gates and inverters associated with each segment of the digital display. These NOR gates are designated by letters which correspond to the segments of the display which they control. To simplify understanding of FIGS. 6 and 7, the interconnection between the first and second decode stage NOR gates have been indicated by the use of split numbered lines. The numbered line from the output of each first stage NOR gate is connected with all the correspondingly numbered lines at the inputs to the second stage NOR gates.

To summarize the operation of the electrical circuits shown in FIGS. 5, 6 and 7, a "high" output from the NOR gate of the first decode stage is produced from the numbered NOR gate corresponding to the number to be displayed, while the outputs from the other NOR gates are "low". That is, if a "9" is to be displayed, a "high" output from the NOR gate designated 9 is produced. These electrical signals are applied to the inputs of the second decode stage NOR gates which are arranged to provide a "low" output from the NOR gate associated with the segments of the display which are to be activated to produce the digit to be dislayed, and a "high" output from the other NOR gates. The outputs from the second stage NOR gates are inverted by an inverter associated with each NOR gate so that the "low" output becomes "high" and the "high" output "low". These "high" outputs then activate the appropriate segments of the display.

As an example of the operation of the optical and electrical system, refer to FIG. 6, and assume that a "5" is to be displayed as the fourth digit. To display a "5", indicia 90 and 92 are present in the encoder and permit light to be transmitted to photoelectric devices D and E to produce a "high" electrical signal at the outputs of these devices. Since no light is transmitted to photocell F, the output of that photocell is "low". The outputs from the photocells are applied directly, and through inverters 94, 96 and 98, to first decode stage NOR gates 1, 3, 5, 7 and 9. The photoelectric devices, inverters and NOR gates are arranged such that only NOR gate 5 has all inputs at a "low" level. Each of the other NOR gates has at least one input at a "high" level. Since the output from a NOR gate is "high" only if all the input signals are "low", only NOR gate 5 produces a "high" output, while all the other NOR gates produce "low" outputs.

The outputs of each of the first decode stage NOR gates are connected to the appropriate second decode stage NOR gates, Q, R, S, T'-T", U, and W. For example, the output of first decode stage NOR gate 5 is connected to the inputs of the Q, W, S, U and T'-T" second stage NOR gates. Since each of the gates has one "high" input from the 5 NOR gate of the first decode stage, the outputs from each of these NOR gates will be low. However, the R NOR gate has only "low" inputs from the 1, 3, 7 and 9 first decode stage NOR gates which produces a high output from the R gate.

Each of the "low" outputs frm the Q, W, S, U, T'-T" NOR gates are inverted by inverters, 100, 102, 104, 106 and 108 respectively, and activate segments Q, W, S, T and U of the digital display to form the number "5". The high output from the R NOR gate is inverted by inverter 110 and the output is not sufficient to activate segment R.

What has just been described is a typical operation of the invention to produce a display of one of the numbers. It will be appreciated that the display of other numbers occurs in the same way and more detail as to the display of these numbers has been omitted in the interest of brevity.

While an illustrative embodiment of the invention has been described in detail, it is to be expressly understood that the invention is not limited thereto. For example, if required, more or less than four digits can be displayed, or each position in the digital display can be arranged to display a greater number of digits by adding additional circuit elements as taught herein. Further, gate circuits other than NOR gates can be used or codes other than binary codes can be used. Furthermore, the station encoder can be in the form of a rotatable disc with the station frequencies encoded in rows extending radially from the center of the disc. Various other changes may also be made in the design and arrangement of the parts without departing from the spirit and scope of the invention as the same is understood by those skilled in the art.

What I claim is:

1. A tuning indicator for a receiver tunable to one of a plurality of radio frequency signals transmitted from a selected distant broadcast station comprising a segmented bar digital display mounted on the receiver housing for viewing by the user of the receiver, a station encoder having encoded thereon in binary form a plurality of sets of station indicia representative of the carrier frequency of said selected broadcast station and a plurality of alignment indicia with an alignment index cooperatively arranged on said station encoder with each set of station indicia, means mounting said station encoder for movement of said sets of station indicia and associated alignment indicia to a reading station in the receiver as the receiver is tuned, an optical reader positioned at the reading station in the receiver including first and second light sources and a fiber optic bundle positioned on opposite sides of said station encoder, said fiber optic bundle having its proximal end terminating at said reading station for alignment with said sets of indicia and associated alignment indicia, first photoelectric device means including input means oriented at the distal end of said fiber optic bundle to receive light transmitted from said first light source through an alignment index and said fiber optic bundle and output means coupled to said second light source for converting said received light into a signal to activate said first light source when said at least one set of indicia is aligned at the reading station, second photoelectric device means oriented at the distal end of said fiber optic bundle to receive light transmitted from said second light source through said set of indicia and said fiber optic bundle when at least one set of indicia is aligned at the reading station for translating the received light into electrical signals indicative of the information encoded on said station encoder, electrical decoding means including input means coupled to receive said electrical signals from said photoelectric device and output means coupled to said digital display for translating said encoded electrical signals into electrical signals for activating the individual bars of said segmented bar digital display to produce a number visible to the user of the receiver indicative of the selected broadcast station.

2. The tuning indicator of claim 1 wherein said electrical decoding means includes first and second decoding stages said first decoding stage coupled to said input means for receiving said binary encoded electrical signals from said photoelectric devices and translating said binary encoded electrical signals into electrical signals indicative of the decimal digit to be displayed, said translated electrical signals being coupled to said second decoding stage for further translation into electrical signals coupled to said output means for activating the individual segmented bars of the digital display to form the number indicative of the selected broadcast station.

3. The tuning indicator of claim 2 wherein said first decoding stage includes at least one NOR gate circuit associated with each decimal digit to be displayed, and said second decoding stages including at least one NOR gate circuit associated with each segment of the digital display to be activated.

4. A tuning indicator for a receiver tunable to one of a plurality of radio frequency signals transmitted from broadcast stations comprising a digital display mounted on said receiver for viewing by the user thereof, a station encoder having a plurality of sets of station indicia each set of station indicia representative of the carrier frequency of one of said broadcast stations, a plurality of alignment indicia, at least one of said plurality of alignment indicia cooperatively positioned and associated with each set of station indicia, means for mounting said station encoder for movement as the receiver is tuned to orient in turn a set of indicia at a reading station in said receiver, an optical reader positioned at the reading station including a first light source, a fiber optic bundle including a plurality of optic fibers having their proximal ends positioned at the reading station for alignment with said station indicia, decoder means having input coupled to the distal ends of said optic fibers and output coupled to said digital display, a second light source positioned at the reading station and arranged to transmit light through said alignment index when a set of indicia is aligned at the reading station, a light sensitive device oriented in the receiver to receive light transmitted from said second light source when a set of indicia is aligned at the reading station, means coupling said light sensitive device in controlling relation to said first light source for actuating said first light source when a set of indicia is aligned at the reading station, light from said first light source being transmitted through a set of station indicia and said optic fibers to said decoder means wherein said light is translated into electrical signals for activating said digital display to produce a visual indication of the selected station.

5. The tuning indicator of claim 4 wherein said digital display includes a segmented bar display and said decoder means includes second light sensitive device means coupled to the distal ends of said optic fibers for translating light from said light source into electrical signals and logic circuit means for translating the electrical signals into signals for activating individual segments of said segmented bar display to provide a visual indication of the selected broadcast station.

6. The tuning indicator of claim 5 wherein the radio frequency information is encoded on said station encoder in binary form.

* * * * *